United States Patent [19]

Bauser et al.

[11] 4,373,988
[45] Feb. 15, 1983

[54] METHOD OF GROWING EPITAXIAL LAYERS FROM A LIQUID PHASE

[75] Inventors: Elisabeth Bauser, Ludwigsburg; Martina Frik, Nuertingen; Karl S. Löchner, Gerlingen; Laurenz Schmidt, Stuttgart, all of Fed. Rep. of Germany

[73] Assignee: Max-Planck-Gesellschaft zur Forderung der Wissenschaften e.V., Göttingen, Fed. Rep. of Germany

[21] Appl. No.: 849,944

[22] Filed: Nov. 9, 1977

Related U.S. Application Data

[63] Continuation of Ser. No. 613,929, Sep. 16, 1975, abandoned.

[30] Foreign Application Priority Data

Sep. 20, 1974 [DE] Fed. Rep. of Germany ....... 2445146

[51] Int. Cl.³ ............................................. C30B 19/00
[52] U.S. Cl. .................................................. 156/622
[58] Field of Search ................ 156/622, 621, 624, 623

[56] References Cited

U.S. PATENT DOCUMENTS

| | | | |
|---|---|---|---|
| 1,353,571 | 9/1920 | Dreibrodt | 156/622 |
| 2,459,869 | 1/1949 | Christensen | 156/623 |
| 3,335,084 | 8/1967 | Mall | 156/622 |
| 3,697,330 | 10/1972 | Minden | 156/622 |
| 3,713,883 | 1/1973 | Lien | 156/622 |
| 3,755,013 | 8/1973 | Hollan | 156/622 |
| 3,873,463 | 3/1975 | Tolksdorf | 156/622 |
| 3,913,212 | 10/1975 | Bachmann et al. | |

FOREIGN PATENT DOCUMENTS 2314109 10/1973 Fed. Rep. of Germany ...... 156/622
49-51180 5/1974 Japan .................................. 156/622

OTHER PUBLICATIONS

Blum, IBM Tech. Discl. Bull., vol. 15 #7, Dec. '72, p. 2091.

*Primary Examiner*—Hiram Bernstein
*Attorney, Agent, or Firm*—Frishauf, Holtz, Goodman & Woodward

[57] ABSTRACT

A rotary head is provided with supply chambers near the center of rotation communicating with slot-like channels extending radially to a surrounding annular space. Substrates are set into holders, such as dovetail guides in the channel walls to expose surfaces to the liquid that flows by through the channels from the supply chambers when the head is set into rotation. The used liquid, after it reaches the annular space, flows down into a catch basin at the bottom of a surrounding casing, which casing also has an opening at the top for loading the supply chambers.

7 Claims, 7 Drawing Figures

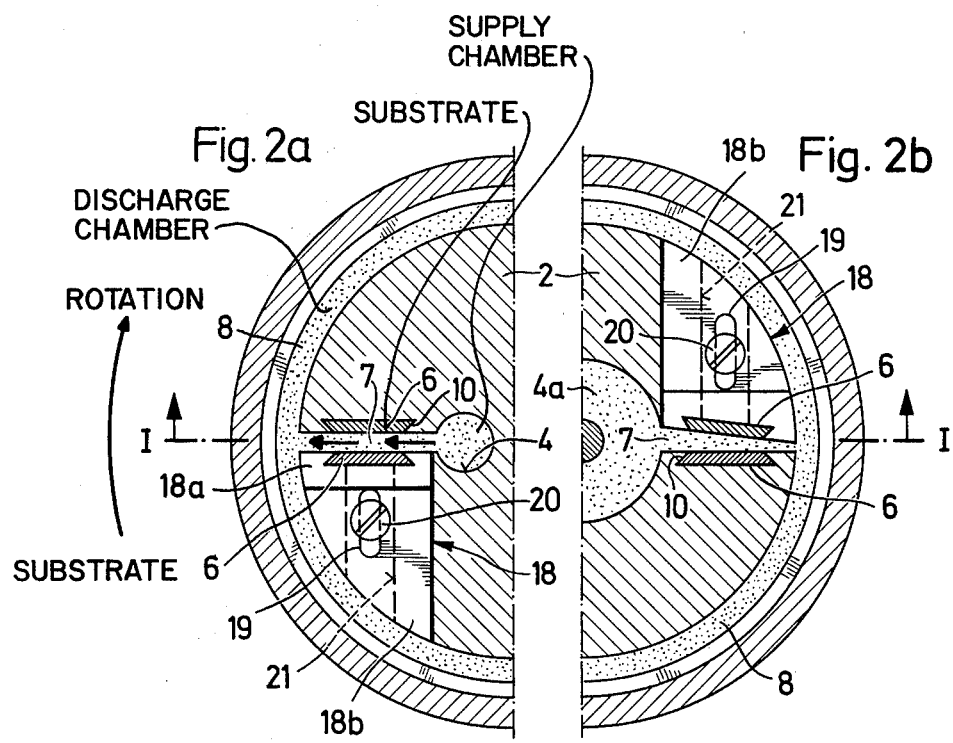
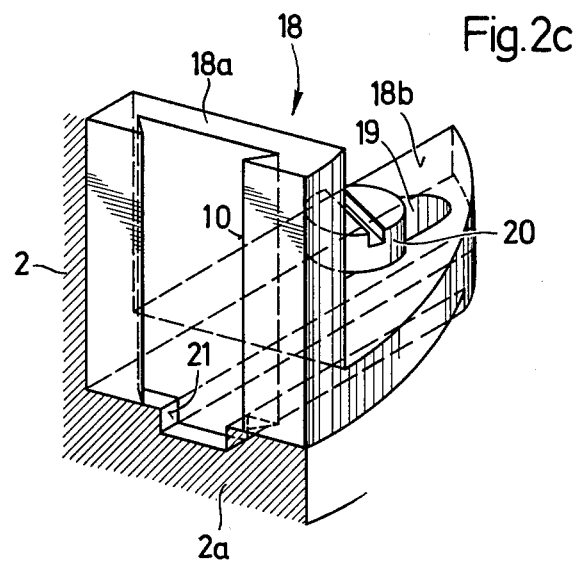

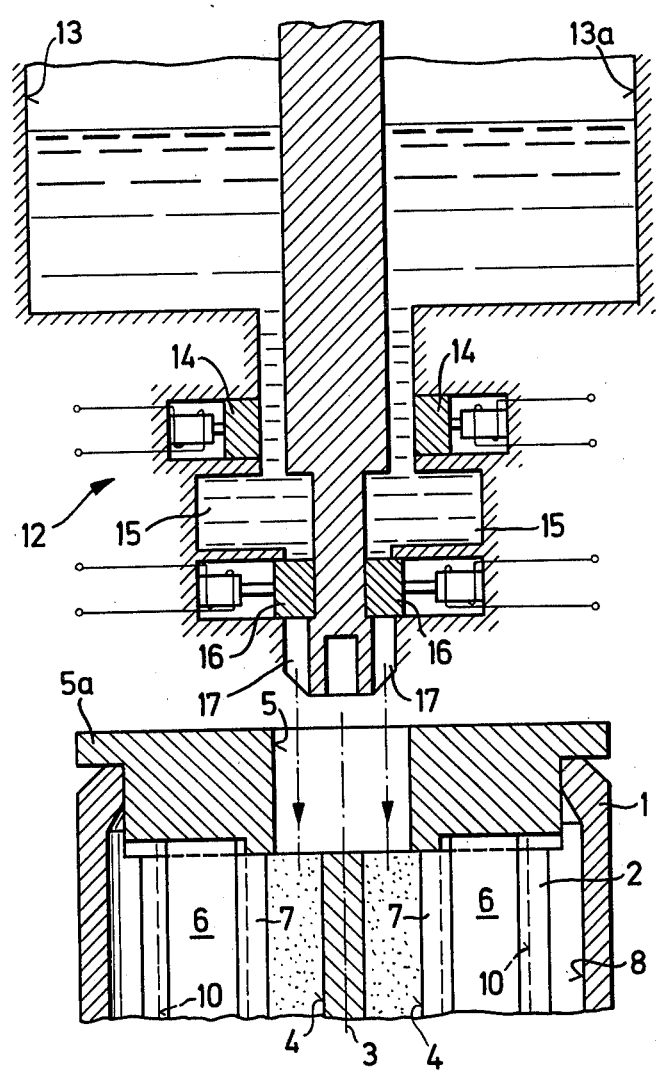

METHOD OF GROWING EPITAXIAL LAYERS FROM A LIQUID PHASE

This is a continuation of application Ser. No. 613,929, filed Sept. 16, 1975.

This invention concerns a method and apparatus for producing a layer on at least one substrate by epitaxial growth, in which a liquid containing the layer forming material is brought into contact with the substrate surfaces to be coated under influence of external forces.

The use of epitaxial layers in the manufacture of electrical components, particularly in the field of semiconductors, has greatly increased in recent years. At present gas phase epitaxy is almost exclusively used as the manufacturing process. There is however an entire series of materials of which the properties correspond substantially better to the requirements of the electrical component manufacture, available if they could be obtained by means of liquid epitaxy as is clear from laboratory experiments. This concerns, for example, the efficiency of electroluminescent diodes and laser diodes.

Certain processes mentioned below are known from a comprehensive description of liquid phase epitaxy under the title "Properties and Applications of III-V Compound Films Deposited by Liquid Phase Epitaxy" by H. Kressel and H. Nelson, published in Volume 6 of "Physics of Thin Films" (1973).

1. The "tipping furnace" (page 117) in which, in a graphite boat at first obliquely held, the substrate to be coated is fixed at a higher lying position of the flat bottom, whereas in a lower lying position liquid containing the material to be deposited epitaxially is located. For the desired duration of the epitaxial precipitation the furnace together with the graphite boat is suddenly tilted in the opposite direction so that the liquid flows over the substrate.

2. The dipping technique (page 118) in which the substrate is simply dipped into the liquid in a standing vessel.

3. The multibin boat method (page 119) in which the substrate is embedded in a slide which can be shifted under a plate provided with various liquid containers, so that the particular liquid covers the substrate. As a variant there is the rotary multibin boat in which the liquid containers are arranged in a circle in a manner similar to a revolver head.

There is the disadvantage in these known methods that epitaxial layer thicknesses less than $0.5\mu$ cannot be reproducibly manufactured. Furthermore, the solutions standing under the influence of gravity only generally do not flow completely away from the substrate after the epitaxial deposition and residual solutions remaining on the treated substrates lead to supplementary irregular further growth of the epitaxial layers and thus to uneven layer thicknesses. Moreover, in the multibin boat method that is presently used for the manufacture of double hetero structures for gallium arsenide lasers the disadvantages arise that the actuation of the slide produces graphite dust, that the slide wears away and that scratches readily take place as a result of slider movement on the epitaxially deposited layers. Furthermore, bits of melt are commonly carried over between the supply containers. This method is, therefore, unsuitable for industrial production just as are also the two others.

Finally, there is known from the article "Liquid Phase Epitaxy Growth of GaP by a Centrifugal Tipping Technique" by S. Y. Lien and J. L. Bestel, a centrifugal process in which the substrates to be coated are fastened to a rotating crucible. The liquid in the lower part of the crucible that revolves with the substrate climbs upwards under the influence of centrifugal force and wets the substrates, so that material can be deposited epitaxially on the substrates out of the liquid. If the apparatus is stopped, the liquid collects again in the lower part of the casing and drips off the substrates by gravity. A similar method is described in German Pat. No. 2,126,487. The substrates are supported, according to this patent, outside of a central liquid supply such that upon rotation of the apparatus the liquid flows over from the supply into the surrounding chamber where the substrates are mounted, and moves upwards the wall of said chamber while covering the substrates. Upon terminating said rotation the liquid will collect at the bottom of the substrate chamber and, after a discharge valve has been opened, is dispensed into a discharge vessel through a port. In these two last mentioned cases also there is the disadvantage of an irregular further growth of the deposited layers as the result of liquid residues remaining on them.

It is an object of the present invention to provide a method of epitaxial deposition of layers on substrates in which after the termination of the desired epitaxial growth, no liquid residues remain on the layers that are formed, so that an undesired irregular further growth of the layers is prevented. Furthermore, the method should be useful not only for laboratory applications, but also for production scale manufacture of epitaxial layers from the liquid phase.

SUMMARY OF THE INVENTION

Briefly, under the influence of external forces the liquid containing the layer-forming material is caused to flow in a straight forward manner out from a supply cavity, over the surfaces of the substrate to be coated with an epitaxial layer and over to a discharge cavity. It is important that the liquid containing the material to be separated out should flow over the surface of the substrate on which the growth should occur and every residual bit of the liquid should be driven off the surface of the grown layer by the external forces as soon as no more liquid is supplied, so that no local further growth can take place which would lead to layer irregularities. The force under the influence of which the liquid is caused to flow over the substrate can, for example, be a centrifugal force. In that case the supply cavity or container for the liquid is located nearer to the center of rotation that the substrate or substrates, so that the liquid as the result of the centrifugal force streams over the surface of the substrate to be coated by an epitaxial layer and flows on to the discharge or collection cavity or space located still further away from the rotation center.

Preferably the substrate surface to be coated is oriented with a component in a radial direction, so that the centrifugal force operating on the liquid residues has a sufficient magnitude. A further possibility is that the liquid in the supply cavity should be put under gas pressure, so that it is squirted out from the supply cavity over the substrate surface cavity into the drain cavity. Here also, every last liquid residue is cleared away by the operating force, in this case by the following stream of propelling gas that sweeps the residues off the treated substrate surfaces.

A practical form of the process of the present invention, furthermore, provides two substrates so arranged that their surfaces to be coated are parallel or inclined to each other and face each other across a spacing, while the liquid flows through the space between the surfaces. In this manner, it is possible to make the process still more economcial, since the liquid flowing between the two substrates is more effectively used and at least two substrates have layers deposited upon them at the same time.

A further important advantage of the process of the invention is that the deposition of the layers takes place out of a flowing liquid and fresh liquid is made continuously available with the full concentration of the material to be deposited, so that in contrast to the known processes, in which the concentration falls off during the deposition time, the deposition process of the present invention can be shorter in time. The process of the invention also provides the further advantage of enabling the formation of two or more different epitaxial layers one over the other, since the supply cavity can be filled with different epitaxy liquids one after the other, from each of which a different epitaxial layer can be deposited, the later layer growing on top of the preceding one. In this manner, it is possible to produce semiconductors with practically any sequence of layers. The different liquids can be brought into the supply cavity or container by means of dosing devices and these dosing devices can be connected to larger supply containers of the epitaxy apparatus.

A device suitable for carrying out the process of the invention, briefly stated, utilizing a chambered body rotating inside a casing on which at least one substrate is fastened is distinguished by the fact that the chambered body has a supply cavity for the liquid located radially inside the place where the substrate is fastened and has a drain or discharge space located radially outside the place where the substrate is fastened. That is, further out from the center of rotation, and these two spaces for supply and drain or collection, are connected by a channel passing by the substrate surfaces to be coated. Conveniently, the walls of this channel can be at least partly constituted by the surfaces to be coated of two parallel or inclined opposed substrates spaced from each other and fastened on the chambered body. A further convenience form of constitution of the device of the invention is one in which at least two channels are provided symmetrically with respect to the axis of rotation. In a further elaboration of the device of the invention, a number of channels parallel to each other can be provided in a linear or wheel spoke array. The linear arrangement lends itself to especially to gas pressure operation. If desired, an individual supply chamber can be provided for each channel which is connected over its particular channel with a drain chamber common to all channels. The drain chamber can conveniently be an annular space located between the rotating head body and the casing, underneath which chamber the casing is constituted as a catch basin. A still further possibility of elaboration of the invention lies in making the width of the channels adjustable. The fastening locations for the substrates can be provided with dovetail guides, so that the substrates can be securely fastened while their surfaces are free and clear. A particularly useful form of construction is provided when the supply chambers are equipped with or made adjacent to dosing devices for selective loading of predetermined quantities of liquid, which may be a sequence of different liquids. In this manner, without extensive rearrangement of the equipment, a number of different epitaxial layers can be grown one above another. For a mere economic use of the liquid it may be desirable to provide for a recycling conduit from the discharge space to the liquid supply. The above-mentioned possibilities of constituting apparatus according to the invention make it possible to make effective use of the process of the invention with relatively small mechanical complication and expense and they are basically well suited for production scale manufacture of epitaxial layers on substrates, as well as for laboratory operations.

BRIEF DESCRIPTION OF THE DRAWINGS

The invention is further described by way of illustrative example with reference to the annexed drawings, in which:

FIG. 2a is a partial cross-section along line II—II in FIG. 1;

FIG. 2b is a partial cross-section through an alternative embodiment of the apparatus according to the invention including a common liquid supply for a plurality of channels;

FIG. 2c is a detail illustrating the gap adjusting means in form of an angular adjustment plate;

FIG. 3 is a schematic illustration of a dosing device for feeding liquid to the supply chambers;

DESCRIPTION OF THE PREFERRED EMBODIMENT

Figure 1:
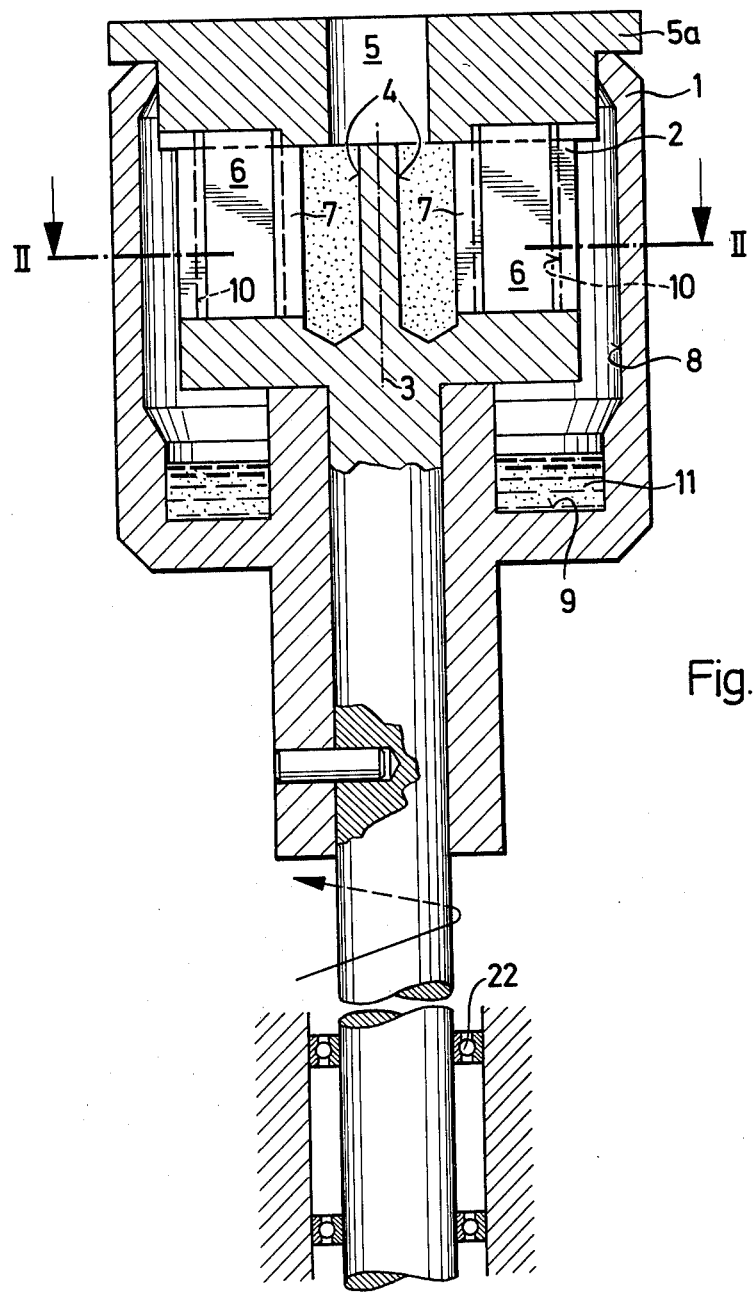
FIG. 1 is a cross-section in a plane passing through the axis of rotation of an embodiment of the invention operating by centrifugal force for depositing epitaxial layers on a substrate from a liquid phase.

The cross-section given in FIG. 1 shows a rotary structure 2 in a casing 1. The structure 2 may be referred to as a crucible or rotating boat by reference to the prior art structures above described which it replaces, but it is evident from the figures of the present drawings that it is actually a cylindrical head, in the external shape of a drum or thick disk having chambers and channels provided therein as further described below.

Figure 4:
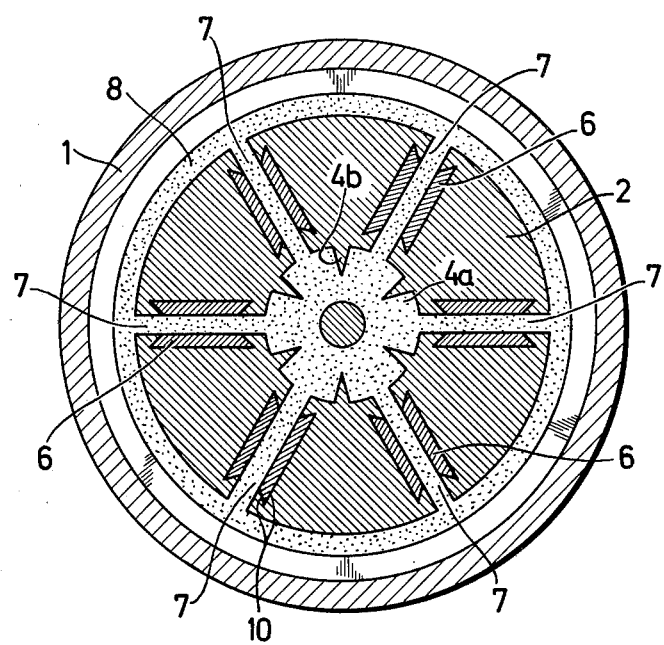
FIG. 4 is a schematic illustration of an alternative embodiment of the inventive apparatus having a plurality of radially disposed channels.

This rotary head 2 has two supply chambers 4 in the neighborhood of its axis of rotation 3, these chambers being shown elongated in a direction parallel to the axis. The supply cavities 4 can be filled through an opening 5 of a cover 5a put onto the upper opening of the casing 1 with a solution of the material to be deposited to form an epitaxial layer on a substrate. In the illustrated embodiment (FIG. 2), four substrates 6 are shown, these being paired so as to form a channel 7 between opposed surfaces of each pair of substrates. When the body 2 is set into rotation, the solution flows from the supply chambers 4, through the channels 7 and into a discharge chamber 8. According to the embodiment illustrated in FIG. 2a each channel has associated thereto an individual supply chamber, whereas the embodiment according to FIGS. 2b and 4 are provided with a common supply chamber 4a for all channels. The discharge space 8 in the illustrated embodiment is an annular space surrounding the body 2 underneath which the casing 1 is provided in the form of a catch basin 9 into which the solution propelled through the slot-like channels 7 finally drains and collects.

As can be seen from FIGS. 2a and 2b, the substrates 6 are so held in dovetail guides 10 provided in the rotary head 2 that their surfaces on which epitaxial growth is to take place are oppositely facing and define the flow channels 7 between them. Instead of being held in the dovetail guides 10 as shown, the substrates of course can also be mounted in otherwise formed holders in the rotary head 2 which, likewise, can provide for a simple insertion of the substrates and an adjustment of the gap width between them which defines the width of the operative portion of the channels 7.

Although in the illustrated example only four substrates 6 forming two channels 7 are shown, of course a considerably larger number of channels for growing epitaxial layers on a larger number of substrates in a ring-like arrangement, i.e. with the cross-section of the channels arranged like spokes of a wheel, can be provided as illustrated for six channels in FIG. 4. For a production scale epitaxial layering on substrates, it is desirable to constitute the rotary head in such a way that as many substrates as possible can be provided with layers at the same time. Furthermore, instead of providing an individual supply chamber 4 for each channel, a central supply chamber 4a can be provided serving all channels collectively and, if desired, as can be seen from FIG. 2b, such a chamber could also be replenished with solution during rotation of the head. Such an arrangement can operate most effectively for good reproducibility if a dosing device 12, as illustrated by way of example in FIG. 3, is provided for filling the supply cavities of the head and, of course, a dosing device can also be readily designed for loading individual supply chambers of the head and to assure even and troublefree filling of the supply cavity or cavities with solution.

According to FIG. 3 the dosing device 12 is connected to a supply vessel 13 and 13a, respectively, from which liquid containing layer forming material flows upon opening of solenoid input valves 14 into measuring tanks 15 so as to fill them. After closing of the input valves 14 the desired output valve 16 will be opened controlled by an electrical control system not shown, so as to discharge the measured liquid through the respective port 17 and through opening 5 of the cover 5a into the supply chamber(s) 4 or 4a. When an epitaxial growth operation has been completed, the rotary head is stopped with the supply chambers 4 in alignment with the discharge ports 17. The valve 17 and the corresponding valve for the other measuring chamber not shown are closed and the valves 16 are opened, and the contents of the measuring chambers 15 drain into the supply chambers 4 of the rotary head. The rotary head may now be started again, either with or without changing the substrates 6, according to whether the next operation is the growing of a layer on a new set of substrates or the growing of a different layer on the same set.

During operation of the rotary head 2, the valves 16 are closed and the valves 14 may be open, so that the dosing chambers such as the measuring chamber 15 may again be filled. The dosing device just described utilizes gravity flow and electrically controlled valves, but of course a piston and cylinder device could also be used to provide mechanically impelled flow and in such a device, the valves may, if desired, be hydraulically or mechanically operated rather than electrically. As mentioned before, if a single central supply chamber is used in the rotary head 2, it may be filled or refilled while the head 2 is rotating. Discharge of the measuring tanks with different liquids is performed in a sequence corresponding to the desired sequence of the layers to be formed.

In the embodiment illustrated in FIG. 4 and including a common supply chamber 4a for all channels 7, radial baffles 4b are provided at the wall of the supply chamber between the individual chambers, in order to ensure the liquid being equally distributed at the individual channels.

FIG. 2 shows an arrangement for adjusting the width of the gap between the substrates, e.g. by providing for an adjustibility of the means mounting the substrates 6 in the crucible, as illustrated by way of example, in FIG. 2a, 2b and 2c. According to this embodiment a substrate is fixed at one leg 18a of an angular mounting plate 18 having another leg provided with an elongated opening 19. A screw 20 extends through opening 19 and is screwed into the bottom 2a of the crucible. Upon unlocking screw 20 the angular plate 18 may be moved along a guide groove 21 so that a desired distance between the substrates may be adjusted by means of a gauge held between the opposing surfaces of the two substrates. By fixing again screw 20 this distance then will be firmly maintained. FIG. 2b illustrates an alternative embodiment having a wedge-like gap. This wedge form results from forming the angular plate 18 with a tapered surface to which the substrate 6 is affixed.

Other ways of modifying the width of the channel 7 can be readily devised.

The parameters for the epitaxial growth process can be widely varied and suited to different requirements and conditions by appropriate determination of the velocity of rotation of the head and the viscosity of the solution. A range of adjustment for the channel width from near 0 to 2 mm. is suitable. The rotational speed can range up to 2800 r.p.m. and according to conditions may also go still higher.

OPERATION

In the use of the device of FIGS. 1 and 2, the substrates 6 are loaded in the dovetail guides 10 of the rotary head 2 and the supply chambers 4 are filled with the desired quantity of solution. Then the head is set into rotation so that the solvent is centrifuged out of the supply cavities, through the channels 7 past the mutually facing surfaces of the substrates and into the discharge receiving space 8. While the liquid flows past the substrate surfaces, epitaxial layers grow out of the solution on the exposed surfaces and after the supply chambers 4 become empty, all residual solution is driven off the grown surfaces as the result of the centrifugal force. Accordingly, after the supply chambers have become empty, the rotation speed can be increased, so that the centrifugal force for sweeping clear the grown surfaces will be greater. In this manner far more even epitaxial layers can be formed than can be produced by the known processes, in which residual solutions tend to remain on the grown surfaces and to produce irregularities.

The solution driven off the substrate and out of the channel into the outer annular space then flows down into the catch basin 9, in which the usual solution 11 collects and from which the used solution can be drawn off.

Although basically the head body 2 is fixed to the casing, so that they both rotate, it is possible to mount the head 2 on bearings in such a way that only the head 2 rotates, while the casing remains fixed. Details of this sort are not shown in the drawings as they need not be illustrated in order for the reader to understand the constitution and construction of the apparatus shown.

In an actual embodiment of the inventive apparatus the bearings are disposed out of the hot region in order to avoid the bearings 22 to be much heated by the temperature of several hundred centigrades required for the epitaxial process.

Figure 5:
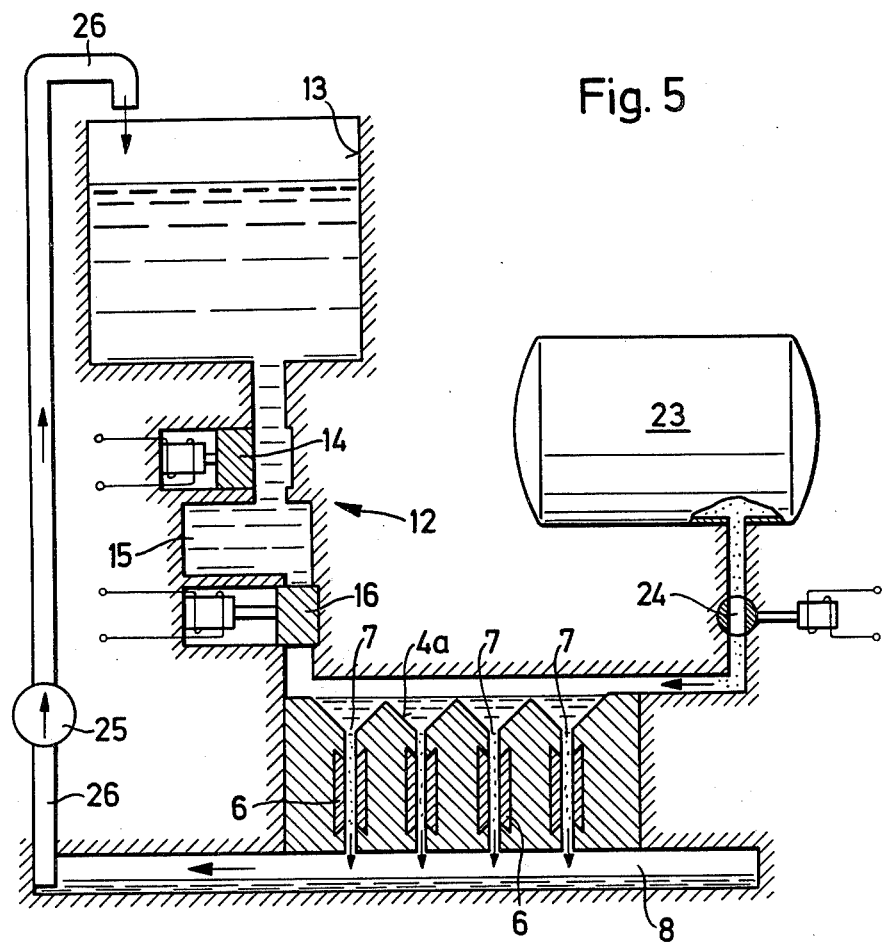
FIG. 5 is a schematic illustration of another alternative embodiment in which the channels are disposed parallel to each other in a linear array.

FIG. 5 illustrates a parallel array of the channels 7. Such apparatus operates with gas pressure rather than with centrifugal force. The gas is supplied to the supply chamber 4a from a pressure vessel 23 under control of a valve 24 and forces the liquid through the channels 7. The used liquid collected in the discharge chamber 8 may be recycled - by means of pump 25 and return conduit 26 - into the supply vessel 13 for being reused after addition of layer forming material, if necessary.

Basically it is possible that - a limited - number of parallel channels is rotated around an axis of rotation located outside of such parallel structure. In such case groups of parallel channels are oppositely disposed around the axis of rotation. The direction of the channels, of course, then deviates from the radial direction. This embodiment will operate as long as the liquid flow over the surfaces of the substrates will still meet the practical requirements of the epitaxial growth.

It should be understood that variations and modifications are possible within the inventive concept.

We claim:
1. Method of economically producing, with high regularity, a layer on at least one substrate by epitaxial growth, comprising the steps of:
   dispersing a layer-forming material in a liquid and providing a predetermined quantity of said liquid containing the layer-forming material in a supply chamber;
   forcing the liquid containing the layer-forming material, under the influence of forces externally applied to said liquid, from said supply chamber into at least one gap-like channel on a wall of which said substrate is firmly held; and
   causing epitaxial crystal growth to take place on said substrate only while said predetermined quantity of liquid containing the layer-forming material flows continuously and uniformly along said substrate until said supply chamber is empty, said liquid being caused to flow under the influence of said externally applied forces from said supply chamber outward as a substantially unidirectional stream, under pressure from opposition to said forces produced by confinement of said liquid by the gaplike configuration of said channel along and past the surface of said substrate at a rate controllable by said applied forces while under more than atmospheric pressure, and out of said channel to a drain chamber.

2. A method as defined in claim 1 in which the liquid is caused to flow under pressure along and past the substrate surface to be coated under the effect of centrifugal forces while both said surface and the liquid are rotated in a rotary device, said substrate being located away from the center of rotation, the said liquid being dispensed from a supply chamber which is nearer the center of rotation of the rotary device than said substrate and drained into said drain chamber at locations farther from the center of rotation than said substrate, so that the liquid flows past the substrate surface to be coated under the influence of centrifugal force.

3. A method as defined in claim 1 in which the liquid is caused to flow from the supply chamber cavity along and past the substrate surface and into the drain chamber under gas pressure.

4. Method as defined in claim 1, in which the substrate is so positioned in a channel connecting the supply chamber with the drain chamber that the surface of said substrate to be coated is flushed by the liquid flowing through the channel.

5. Method as defined in claim 4, in which the substrate surface to be coated is disposed in a radial plane, or oriented with a radial component.

6. Method as defined in claim 4, in which two substrates are arranged at oppositely located channel walls in such a way that their surfaces to be coated are parallel or inclined to each other and spaced from each other and so that the liquid may flow under pressure through the space between their respective surfaces.

7. A method as defined in claim 1 in which prior to the step of forcing the liquid containing the layer-forming material into at least one gap-like channel, the width of said channel is adjusted.

* * * * *